United States Patent
Hsieh et al.

(10) Patent No.: US 11,133,159 B1
(45) Date of Patent: Sep. 28, 2021

(54) PLASMA POLYMERIZATION APPARATUS AND PLASMA POLYMERIZATION METHOD USING THE SAME

(71) Applicant: MING CHI UNIVERSITY OF TECHNOLOGY, New Taipei (TW)

(72) Inventors: Jang-Hsing Hsieh, New Taipei (TW); Chuan Li, Taipei (TW); Nima Bolouki, New Taipei (TW); Himanshu Mishra, New Taipei (TW)

(73) Assignee: MING CHI UNIVERSITY OF TECHNOLOGY, New Taipei (TW)

( * ) Notice: Subject to any disclaimer, the term of this patent is extended or adjusted under 35 U.S.C. 154(b) by 0 days.

(21) Appl. No.: 16/831,186

(22) Filed: Mar. 26, 2020

(51) Int. Cl.
| | |
|---|---|
| *B05D 1/32* | (2006.01) |
| *H01J 37/32* | (2006.01) |
| *H01J 37/24* | (2006.01) |
| *H05H 1/24* | (2006.01) |
| *B05D 1/00* | (2006.01) |
| *B05D 3/14* | (2006.01) |

(52) U.S. Cl.
CPC .......... *H01J 37/32743* (2013.01); *B05D 1/62* (2013.01); *B05D 3/141* (2013.01); *H01J 37/241* (2013.01); *H01J 37/3244* (2013.01); *H01J 37/32082* (2013.01); *H01J 37/32568* (2013.01); *H05H 1/24* (2013.01); *H01J 2237/1825* (2013.01); *H01J 2237/332* (2013.01); *H01J 2237/3382* (2013.01)

(58) Field of Classification Search
CPC combination set(s) only.
See application file for complete search history.

(56) References Cited

U.S. PATENT DOCUMENTS

| | | | |
|---|---|---|---|
| 8,747,962 B2 * | 6/2014 | Bicker | C23C 16/006 427/569 |
| 2006/0196419 A1 * | 9/2006 | Tudhope | F16L 58/04 118/715 |
| 2011/0059284 A1 * | 3/2011 | Butzloff | B29C 66/1122 428/57 |

* cited by examiner

*Primary Examiner* — Dah-Wei D. Yuan
*Assistant Examiner* — Kristen A Dagenais-Englehart
(74) *Attorney, Agent, or Firm* — Muncy, Geissler, Olds & Lowe. P.C.

(57) ABSTRACT

A plasma polymerization apparatus is provided for forming a polymerization coating on an inner surface of an object. The plasma polymerization apparatus comprises a chamber, a gas supply, a monomer source, a first electrode, a second electrode, a power source, and a metal foil. The gas supply is connected to the chamber for filling the chamber with a working gas. The monomer source is connected to the chamber for providing a vaporized monomer material into the chamber. The first electrode is located at a first side of the chamber. The second electrode is located at a second side of the chamber. The power source is electrically connected to the first electrode and the second electrode for generating plasma. The metal foil is wrapped around an outer surface of the object and placed between the first electrode and the second electrode. A plasma polymerization method is also provided.

3 Claims, 10 Drawing Sheets

PLASMA POLYMERIZATION APPARATUS AND PLASMA POLYMERIZATION METHOD USING THE SAME

BACKGROUND OF INVENTION

1. Field of the Invention

The present invention is related to plasma technology, and more particularly is related to a plasma polymerization apparatus and a plasma polymerization method using the same.

2. Description of the Prior Art

Plasma polymerization is a process by which a thin layer of polymeric film is deposited on a surface which is in contact with the plasma of the organic monomer, and the plasma polymerized materials have played an important role in various fields, such as biosensor, fuel cell membrane, and dielectric thin-film coatings.

Although plasma polymerization is known for providing polymerization coatings on various substrates, it is difficult to form a conformal polymerization coating on an inner surface of an object, such as a tube, which is quite useful for biological applications.

SUMMARY OF THE INVENTION

Accordingly, it is a main object of the present invention to provide a plasma polymerization apparatus and a polymerization method using the same for forming polymerization coatings on the inner surface of an object.

A plasma polymerization apparatus is provided in the present invention for forming a polymerization coating on an inner surface of an object. The plasma polymerization apparatus comprises a chamber, a gas supply, a monomer source, a first electrode, a second electrode, a power source, and a metal foil. The gas supply is connected to the chamber for filling the chamber with a working gas. The monomer source is connected to the chamber for providing a vaporized monomer material into the chamber. The first electrode is located at a first side of the chamber. The second electrode is located at a second side of the chamber. The power source is electrically connected to the first electrode and the second electrode for generating plasma. The metal foil is wrapped around an outer surface of the object and placed between the first electrode and the second electrode.

In accordance with an embodiment of the plasma polymerization apparatus, the object is a tube, and as a preferred embodiment, the object is a silicone tube.

In accordance with an embodiment of the plasma polymerization apparatus, the working gas is Ar.

In accordance with an embodiment of the plasma polymerization apparatus, the chamber is kept at a working pressure ranged between 0.2 to 0.4 torr.

In accordance with an embodiment of the plasma polymerization apparatus, the power source is a RF power source.

In accordance with an embodiment of the plasma polymerization apparatus, the first electrode and the second electrode are plane electrodes.

In accordance with an embodiment of the plasma polymerization apparatus, the metal foil is placed on a surface of the first electrode facing the second electrode.

In accordance with an embodiment of the plasma polymerization apparatus, the metal foil is a copper foil.

A plasma polymerization method is also provided in accordance with the present invention, The plasma polymerization method is executed by using the aforementioned plasma polymerization apparatus for forming a polymerization coating on an inner surface of an object. The plasma polymerization method comprises the steps of: wrapping an outer surface of the object with a metal foil; placing the wrapped object in the chamber between the first electrode and the second electrode; filling the chamber with a working gas; injecting a vaporized monomer material into the chamber; and applying a high voltage pulse to the first electrode and the second electrode to generate plasma in the chamber.

By using the plasma polymerization apparatus and the plasma polymerization method provided in the present invention, the conformal polymerization coating can be easily formed on the inner surface of an object, such as a tube, so as to change the surface characteristics of the object with the inner surface to meet the needs of various applications, such as biological application, fuel cell membrane, and etc.

BRIEF DESCRIPTION OF THE DRAWINGS

The present invention will now be specified with reference to its preferred embodiment illustrated in the drawings, in which.

DESCRIPTION OF THE PREFERRED EMBODIMENT

Figure 1:
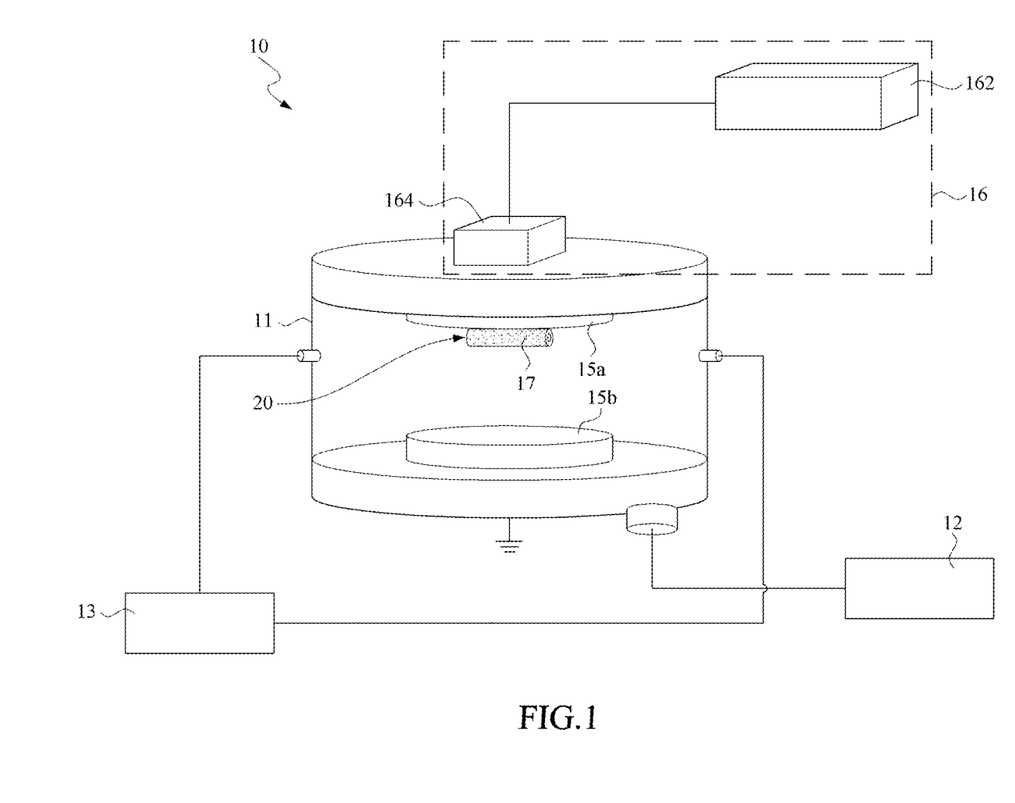
FIG. 1 is a schematic view of the plasma polymerization apparatus provided in accordance with an embodiment of the present invention.

FIG. 1 is a schematic view of the plasma polymerization apparatus provided in accordance with an embodiment of the present invention. The plasma polymerization apparatus 10 provided in the present invention is utilized for forming a polymerization coating on an inner surface of an object, such as a tube 20. For example, the object can be an artificial blood vessel. The artificial blood vessel usually needs an inner coating to enhance the surface characteristics so as to match the function of the nature blood vessel. The object may be composed of the polymer material such as PET, PETE, PTFE, PE, silicon rubber, PVC, PU, and etc. Any material capable to be treated with plasma should be applicable to the plasma polymerization apparatus 10 of the present invention. However, the present invention should not be restricted thereto. The other hollow object with an inner space communicated with the outer environment should be applicable in the present invention.

As shown, the plasma polymerization apparatus 10 comprises a chamber 11, a vacuum system 12, a gas supply 13, a monomer source 14, a first electrode 15a, a second electrode 15b, a power source 16, and a metal foil 17.

The chamber 11 is sealable to form an inner space. The vacuum system 12 is connected to the chamber 11 for evacuating the inner space of the chamber 11. The gas supply 13 is connected to the chamber 12 for supplying a working gas to the inner space of the chamber 11. In accordance with an embodiment of the present invention, the working gas may be an inert gas, such as Ar. In accordance with an embodiment of the present invention, the chamber 11 may be filled with the working gas and kept at a working pressure ranged between 0.2 to 0.4 torr during the polymerization process. As an embodiment of the present invention, the chamber 11 may be a stainless chamber with a diameter of 30 cm. However, the present invention should not be restricted thereto. The chamber 11 may be of various size and shapes at least depends on the size of the object 20 as well as the allocation of the electrodes 15a, 15b in the chamber 11.

The monomer source 14 is connected to the chamber 11 for providing a vaporized monomer material into the inner space of the chamber 11. The monomer material may be methyl methacrylate to form PMMA coating on the inner surface of the object 12. However, the present invention should not be restricted thereto. The other monomer materials may be applied to the present invention based on the polymerization coating to be formed. For example, the monomer material may be cyclopropylamine, allylamine, diamino cyclohexane, heptylamine, ethylenediamine, butylamine, propargylamine, or propylamine.

The first electrode 15a is located at a first side of the inner space of the chamber 11. The second electrode 15b is located at a second side of the inner space of the chamber 11. In the present embodiment, the first electrode 15a is the upper electrode, and the second electrode 15b is the lower electrode.

The power source 16 is electrically connected to the first electrode 15a and the second electrode 15b for generating plasma within the chamber, especially the space between the first electrode 15a and the second electrode 15b. To be more precisely, the first electrode 15a can be a powered electrode, and the second electrode 15b can be a grounded electrode. The power source 16 may be a RF power source. This configuration can be referred as a capacitively coupled RF plasma reactor.

In accordance with an embodiment of the present invention, the first electrode 15a and the second electrode 15b may be two plane electrodes to form a uniform electric field therebetween to guarantee the uniformity of the polymerization coating. As a preferred embodiment, the first electrode 15a and the second electrode 15b may be two parallel circular plane electrodes with a diameter of 24.5 cm placed 60 mm apart.

In accordance with an embodiment of the present invention. The power source 16 may include a RF power supply 162 and an adjustable impedance-matching network 164. The impedance for the power source 16 may be kept constant at 50Ω, and an adjustable impedance-matching network 162 is used to ensure an optimum RF-power transmission to generate plasma.

Figure 2:
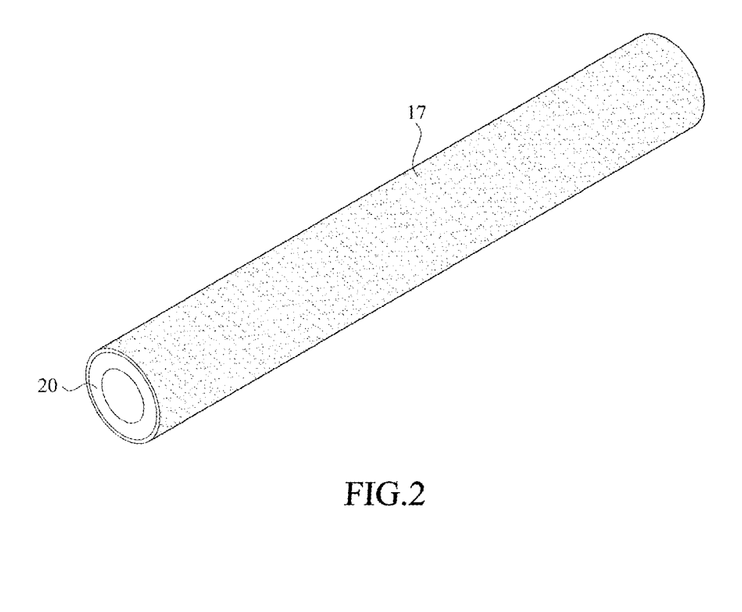
FIG. 2 is a schematic view showing the tube with a metal foil wrapped on the outer surface thereof in accordance with an embodiment of the present invention.

In addition to FIG. 1, please also refer to FIG. 2, which is a schematic view showing the tube 20 with a metal foil 17 wrapped on the outer surface thereof in accordance with an embodiment of the present invention. As shown, the metal foil 17 is wrapped around an outer surface of the tube 20 and placed between the first electrode 15s and the second electrode 15b. In accordance with an embodiment of the present invention, the metal foil 17 may be a copper foil, the tube 20 may be a silicone tube.

As an embodiment of the present invention, the metal foil 17 wrapped around the outer surface of the tube 20 may be attached to a surface of the first electrode 15a facing the second electrode 15b. The metal foil 17 may be electrically connected to the first electrode 15a. However, the present invention should not be restricted thereto. In another embodiment, the metal foil 17 may be attached to the second electrode 15b.

In the present embodiment, the first electrode 15a is the upper electrode and the second electrode 15b is the lower electrode. The metal foil 17 together with the tube 20 may be hanged on the surface of the first electrode 15a by using the adhesive tapes. As a preferred embodiment, the adhesive tapes can be the pressure-sensitive adhesive tapes, and the width of the adhesive tapes depends on the length of the tube. However, the present invention should not be so restricted thereto. The other adhesive means, such as glues, can also be applied in the present invention to have the metal foil 17 placed between the first electrode 15a and the second electrode 15b. In order to guarantee the metal foil 17 together with the tube 20 can be steadily placed between the first electrode 15a and the second electrode 15b, the high temperature heat-resistant adhesive tapes are preferred.

Figure 3:
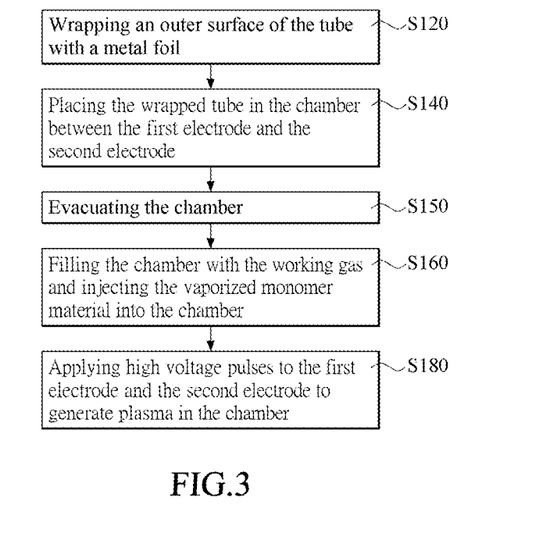
FIG. 3 is a flowing chart showing the plasma polymerization method for forming a polymerization coating on an inner surface of an object in accordance with an embodiment of the present invention.

FIG. 3 is a flowing chart showing the plasma polymerization method for forming a polymerization coating on an inner surface of an object in accordance with an embodiment of the present invention. The plasma polymerization method may be executed by using the aforementioned plasma polymerization apparatus 10.

Please also refer to FIG. 1 and FIG. 2, firstly, in step S120, the tube 20 is wrapped by the metal foil 17. Then, in step S140, the metal foil 17 together with the tube 20 are placed between the first electrode 15a and the second electrode 15b. As an embodiment of the present invention, the tube 20 may be a silicone tube, the metal foil 17 may be a copper foil, and the metal foil 17 together with the tube 20 may be placed on the lower surface of the first electrode 15a by using the adhesive tapes.

Afterward, in step S150, the chamber 11 is evacuated by using the vacuum system 12. Once the vacuum pressure within the chamber 11 is stabilized, in step S160, the chamber 11 is filled with the working gas and the vaporized monomer material is injected into the chamber 11 until the chamber pressure reaches the desired working pressure, e.g. between 0.2-0.4 torr, indicated by the pressure gauge. This step may be executed by controlling the valve (not shown) on the gas pipe between the chamber 11 and the gas supply 13 and the valve (not shown) on the monomer pipe between the chamber 11 and the monomer source 14.

Then, in step S180, the power source 16 is turned on to apply high voltage RF pulses to the first electrode 15a and the second electrode 15b to generate plasma in the chamber so as to start the polymerization process. It is noted that the monomer flow to the chamber 11 is driven by the pressure difference between the chamber 11 and the container of the monomer source 14, and thus, the working pressure within the chamber 11 should be kept lower than the pressure within the container of the monomer source 14 to maintain the monomer flow until the polymerization process is ended.

Figure 4:
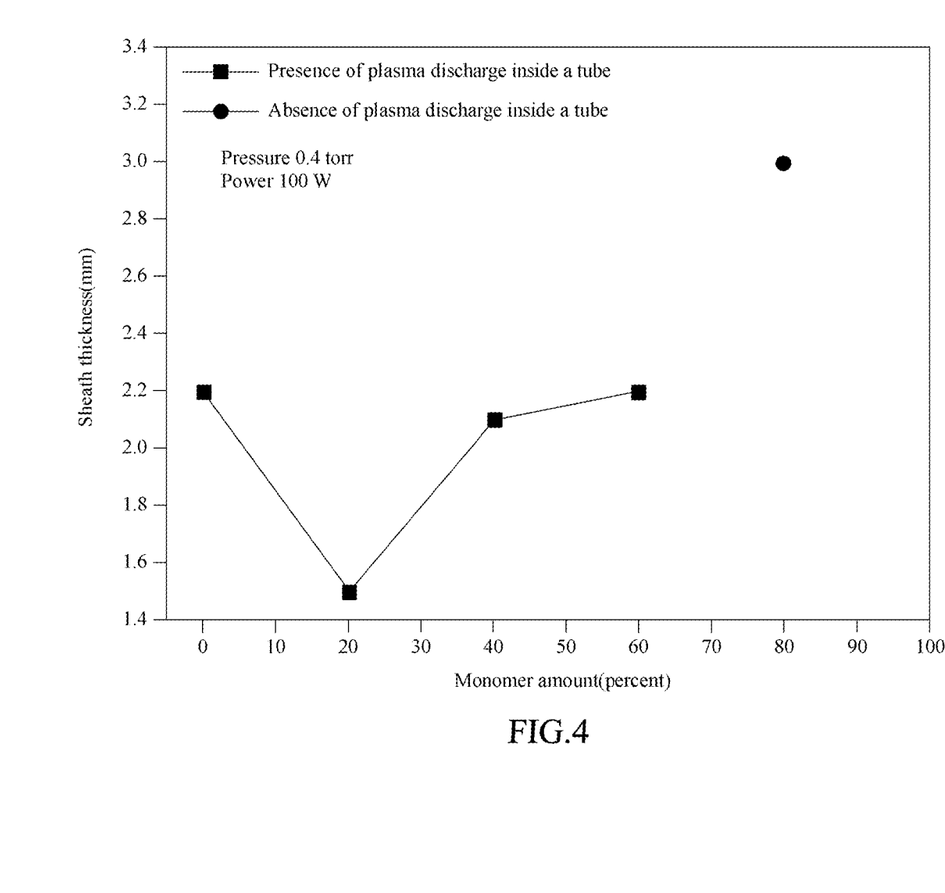
FIG. 4 is a diagram showing the experimental result of the relationship between monomer amount and thickness of the sheath.
Figure 5:
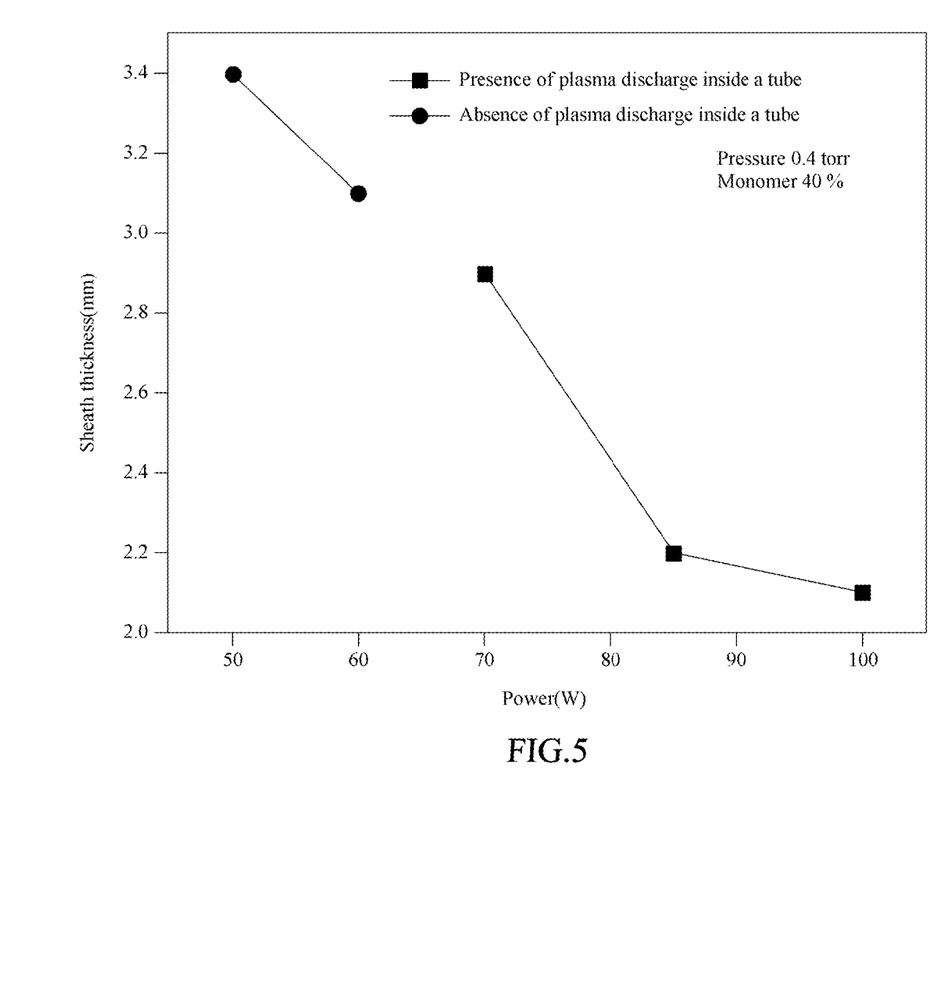
FIG. 5 is a diagram showing the experimental result of the relationship between power and thickness of the sheath.
Figure 6:
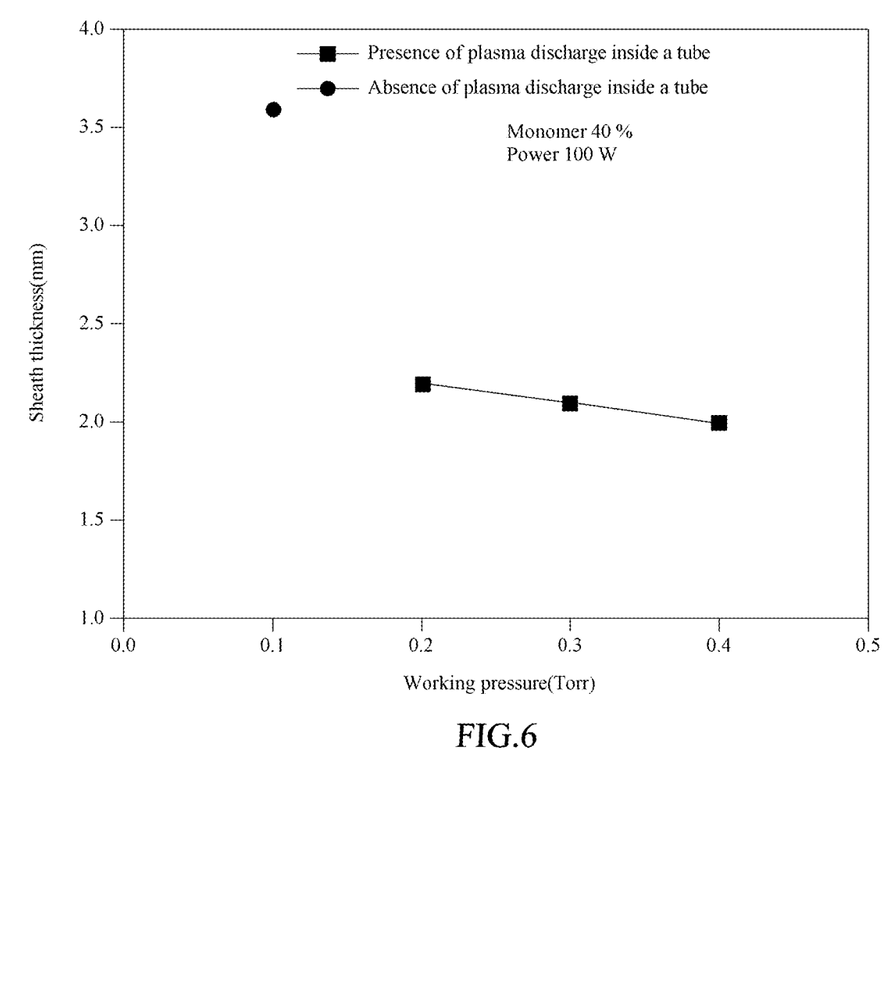
FIG. 6 is a diagram showing the experimental result of the relationship between working pressure and thickness of the sheath.

Three major parameters, i.e. monomer percentage, working pressure, and power, may influence thickness of the sheath in the chamber, and further influence the plasma polymerization process on the inner surface of the tube. FIG. 4 is a diagram showing the experimental result of the relationship between monomer amount and thickness of the sheath, FIG. 5 is a diagram showing the experimental result of the relationship between working pressure and thickness of the sheath, and FIG. 6 is a diagram showing the experimental result of the relationship between power and thickness of the sheath. The experiment is carried out by using the plasma polymerization apparatus features a stainless chamber with a diameter of 30 cm, two parallel circular plane electrodes (the first electrode 15a and the second electrode 15b) with a diameter of 24.5 cm placed 60 mm apart, and a power source with the impedance kept constant at 50Ω and an adjustable impedance-matching network to ensure an optimum RF-power transmission to generate plasma. The working gas is Ar, the monomer material is methyl methacrylate, and the silicone tube with an inner radius of 3 mm and a length of 8 mm is placed in the chamber.

FIG. 4 is a diagram showing the experimental result of the relationship between monomer amount and thickness of the sheath. The pressure and the power are kept unchanged to be 0.4 Torr and 100 W, respectively. Monomer amount in this diagram is calculated by using the function: Monomer amount={1−(Working Pressure before monomer injection (Torr))/(Working Pressure after monomer injection (Torr))}*100, and the monomer amount would be represented by percentage.

The sheath is the transition region between plasma and surface. If the thickness of sheath is greater than the half the size of the hole in the object, e.g. the inner radius of the tube, there would be no plasma generated inside the hole, and thus no polymerization coating would be formed on the inner surface of the hole of the object, i.e. the inner surface of the tube. If the thickness of sheath is smaller than the inner radius of the tube, plasma would be capable to extend into the tube to cause the polymerization process. As shown, when monomer amount is greater than 80 percent of the whole working gas measured by pressure, no plasma discharge would be generated inside the tube. Thus, in order to guarantee the generation of plasma discharge within the tube, the monomer amount may be changed from less than 20 percent to 60 percent.

FIG. 5 is a diagram showing the experimental result of the relationship between power and thickness of the sheath. The pressure and the monomer percentage remain unchanged to be 0.4 torr and 40%, respectively. As shown, when the power is less than or equal to 60 watts, no plasma discharge would be generated inside the tube. Thus, in order to guarantee the generation of plasma discharge within the tube, the power may be change 70 to 100 watts.

FIG. 6 is a diagram showing the experimental result of the relationship between working pressure and thickness of the sheath. The monomer and the power remain unchanged to be 40% and 100 W, respectively. As shown, when working pressure is less than or equal to 0.1 torr, no plasma discharge would be generated inside the tube. Thus, in order to guarantee the generation of plasma discharge within the tube, the working pressure may be changed from 0.2 to 0.4 torr.

Figure 7:
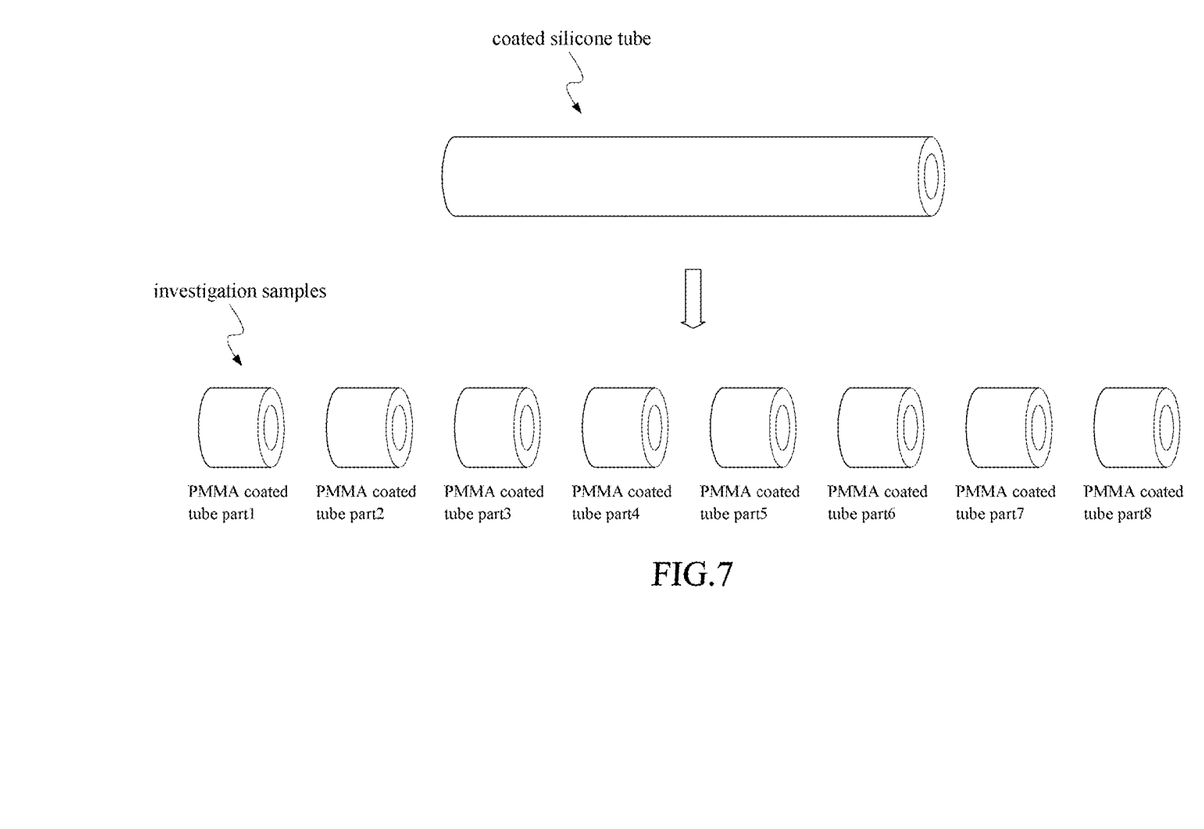
FIG. 7 is a schematic view showing the 8 investigation samples under the polymerization treatment carried out by using the plasma polymerization apparatus in accordance with the present invention.

FIG. 7 is a schematic view showing the investigation samples under the polymerization treatment carried out by using the plasma polymerization apparatus working on the experimental results shown in FIG. 4 to FIG. 6, and the PMMA coating layer is formed on the inner surface of the silicone tube. As shown, the coated silicone tube with a diameter of 3 mm and a length of 8 mm is cut into 8 pieces (Part 1 to Part 8) along the axial direction of the silicone tube as the investigation samples. Each investigation sample (PMMA coated tube Part 1 to Part 8) has a thickness of 1 cm.

Figure 8A:
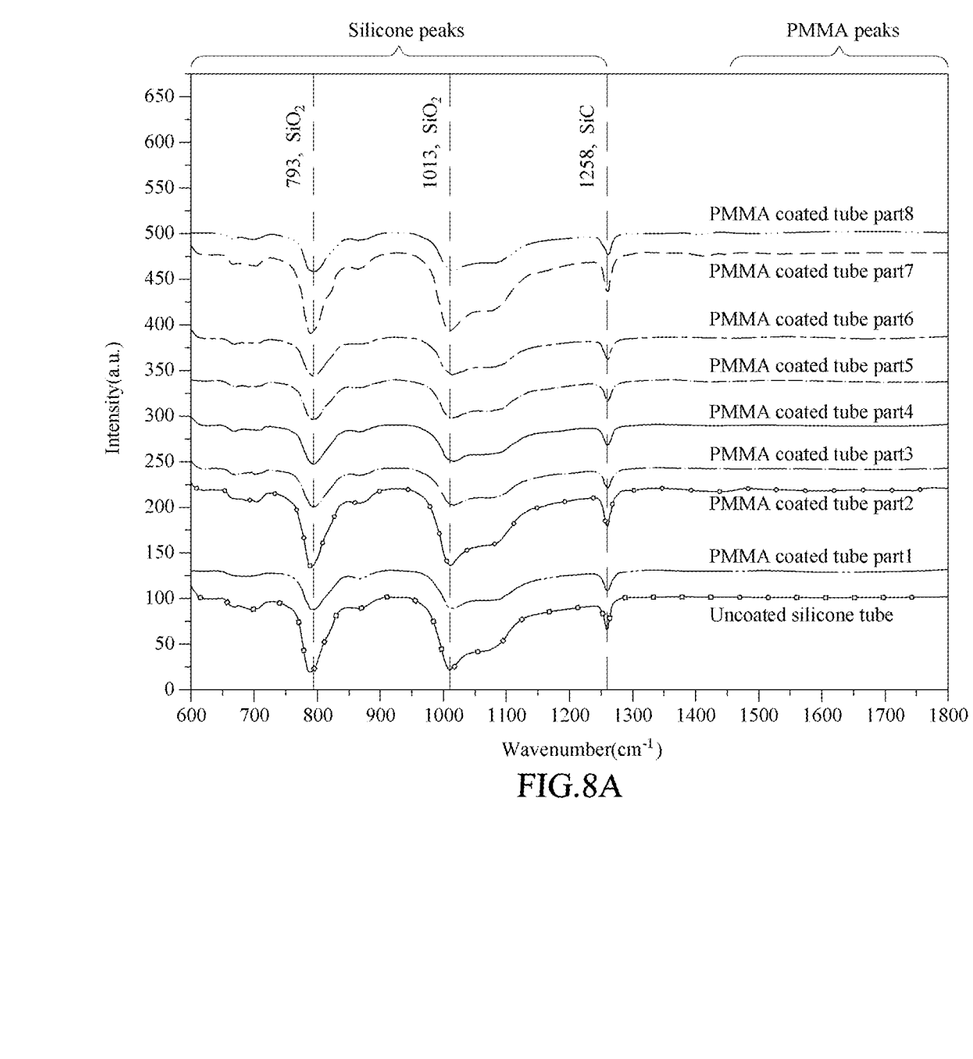
FIG. 8A to 8C are diagrams showing the chemical composition of the deposited polymer material on the inner surface of the 8 investigation samples shown in FIG. 7.
Figure 8B:
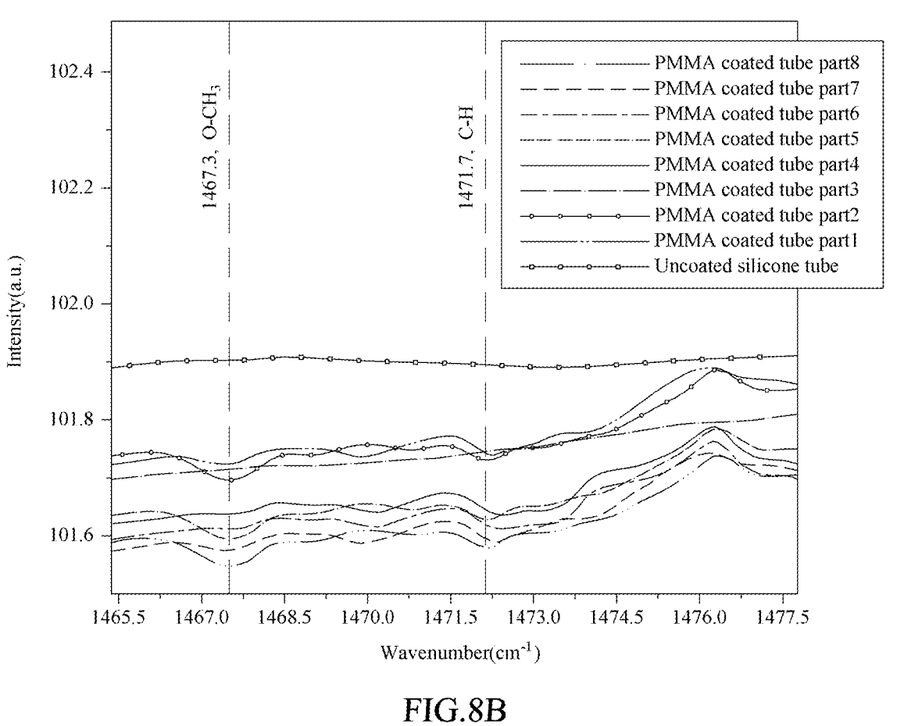
Figure 8C:
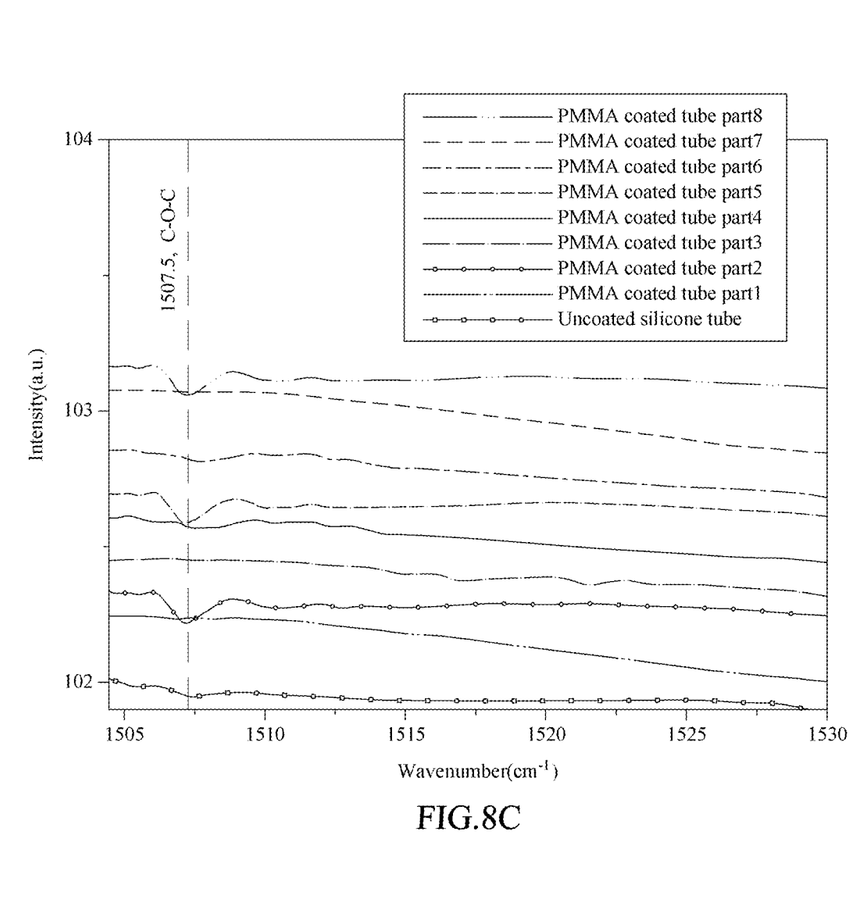

FIG. 8A to 8C are diagrams showing the chemical composition of the deposited polymer material on the inner surface of the 8 investigation samples (PMMA coated tube Part 1 to Part 8) shown in FIG. 7. The data was investigated by using attenuated total reflection Fourier transform infrared spectrometry (ATR-FTIR) in the wavelength range of 600-1800 $cm^{-1}$ with a resolution of 1 $cm^{-1}$ in transmission mode with 20 scans. FIG. 8A shows the waveforms of the whole wavelength range (600-1800 $cm^{-1}$). FIG. 8B and FIG. 8C show the detail portions of the waveforms corresponding to PMMA, i.e. the polymer material to be coated on the inner surface of the silicone tube, wherein FIG. 8B shows the waveforms corresponding to the wavelength range of 1465.5-1477.5 $cm^{-1}$, and FIG. 8C shows the waveforms corresponding to the wavelength range of 1505-1530 $cm^{-1}$.

In addition to the waveforms corresponding to the 8 samples (PMMA coated tube parts 1-8), a waveform corresponding to the uncoated silicone tube is shown as a reference.

As shown in FIG. 8A, all the waveforms have the identical peaks at the wavelengths of 793 $cm^{-1}$, 1013 $cm^{-1}$, and 1258 $cm^{-1}$, which are the FTIR peaks corresponding $SiO_2$, $SiO_2$ and SiC respectively. These peaks may indicate the existence of silicone material.

As shown in FIG. 8B, in compared with the waveform corresponding to the uncoated sample, the waveforms corresponding to the 8 investigation samples have the common peaks at the wavelengths of 1467.3 $cm^{-1}$ and 1471.7 $cm^{-1}$, which are the FTIR peaks corresponding to O—$CH_3$ and C—H, respectively. In addition, as shown in FIG. 8C, in compared with the waveform corresponding to the uncoated sample, at least three investigation samples have the common peaks at the wavelength of 1507.5, which is the FTIR peak corresponding to C—O—C. The peaks of the waveforms corresponding to the 8 investigation samples may indicate the formation of polymerization layer, i.e. the PMMA layer, on the inner surface of the investigation samples to prove the existence of polymerization coating on the inner surface of the tube.

By using the plasma polymerization apparatus provided in the present invention, the conformal polymerization coating can be easily formed on the inner surface of an object, such as a tube, so as to change the surface characteristics of the object with the inner surface to meet the needs of various applications, such as biological application, fuel cell membrane, and etc.

While the present invention has been particularly shown and described with reference to a preferred embodiment, it will be understood by those skilled in the art that various changes in form and detail may be without departing from the spirit and scope of the present invention.

What is claimed is:

1. A plasma polymerization method for forming a polymerization coating on an inner surface of an object by using the plasma polymerization apparatus comprising a chamber, a first electrode and a second electrode, wherein the first electrode and the second electrode are located in the chamber, and the plasma polymerization method comprising the steps of:

wrapping an outer surface of the object with a metal foil;

placing the wrapped object in the chamber between the first electrode and the second electrode and on a surface of the first electrode facing the second electrode;

filling the chamber with a working gas;

injecting a vaporized monomer material into the chamber; and applying a voltage pulse to the first electrode and the second electrode to generate plasma in the chamber.

2. The plasma polymerization method of claim 1, wherein the plasma generated in the chamber has a thickness of sheath smaller than half a size of a hole of the object.

3. The plasma polymerization method of claim 1, wherein the object is a tube, and the plasma generated in the chamber has a thickness of sheath smaller than an inner radius of the tube.

* * * * *